United States Patent [19]

Rzedzian et al.

[11] Patent Number: 5,285,161
[45] Date of Patent: Feb. 8, 1994

[54] CIRCUITRY FOR DRIVING FIELD-GENERATING COIL OF MAGNETIC RESONANCE IMAGING SYSTEM

[75] Inventors: Richard Rzedzian, Lexington; Stephen Crump, Newton Center, both of Mass.

[73] Assignee: Advanced NMR Systems, Inc., Wilmington, Mass.

[21] Appl. No.: 70,639

[22] Filed: Jun. 1, 1993

Related U.S. Application Data

[63] Continuation of Ser. No. 537,380, Jun. 13, 1990, abandoned.

[51] Int. Cl.⁵ .............................................. G01R 33/20
[52] U.S. Cl. ..................................... 324/322; 324/318
[58] Field of Search ................... 324/300, 318, 322; 128/653.5; 310/321, 316; 307/268, 490; 328/223, 113

[56] References Cited

U.S. PATENT DOCUMENTS

| | | | |
|---|---|---|---|
| 3,238,382 | 3/1966 | Ott | 307/268 |
| 4,031,559 | 6/1977 | Peters | 361/52 |
| 4,437,053 | 3/1984 | Bax | 324/322 |
| 4,509,015 | 4/1985 | Ordidge et al. | 324/309 |
| 4,612,596 | 9/1986 | Fox | 361/146 |
| 4,628,264 | 12/1986 | Rzedzian | 324/318 |
| 4,644,282 | 2/1987 | Kestler | 324/322 |
| 4,668,904 | 5/1987 | Kuplainen | 323/350 |
| 4,733,182 | 3/1988 | Clarke et al. | 324/311 |
| 4,742,304 | 5/1988 | Schnall et al. | 324/318 |
| 4,755,756 | 7/1988 | Nishihara et al. | 324/322 |
| 4,764,726 | 8/1988 | Misic et al. | 324/322 |
| 4,791,350 | 12/1988 | Roof | 323/284 |
| 4,812,761 | 3/1989 | Vaughan, Jr. | 324/307 |
| 4,820,986 | 4/1989 | Mansfield et al. | 324/322 |
| 4,837,515 | 6/1989 | Nishihara et al. | 324/318 |
| 4,840,063 | 12/1989 | Haragashira | 324/322 |
| 4,845,420 | 7/1989 | Oshizawa et al. | 323/222 |
| 4,862,057 | 8/1989 | Contartese et al. | 323/285 |
| 4,862,084 | 8/1989 | Mitomi | 324/309 |
| 5,017,871 | 5/1991 | Mueller et al. | 324/322 |
| 5,066,914 | 11/1991 | Vavrek | 324/322 |
| 5,079,503 | 1/1992 | Siebold et al. | 324/309 |

Primary Examiner—Michael J. Tokar
Assistant Examiner—Raymond Y. Mah
Attorney, Agent, or Firm—Fish & Richardson

[57] ABSTRACT

A series topology is provided for the magnetic-field-generating coil and storage capacitor in the circuitry driving the coil of an MRI system. The coil and capacitor thus form a series resonant circuit that can deliver a sinusoidal current through the coil at a resonant frequency. A power source and switch are connected in series with the coil and capacitor, and current flow to the coil is initiated and interrupted by closing and opening the switch.

22 Claims, 4 Drawing Sheets

CIRCUITRY FOR DRIVING FIELD-GENERATING COIL OF MAGNETIC RESONANCE IMAGING SYSTEM

This is a continuation of application Ser. No. 07/537,380, filed Jun. 13, 1990, now abandoned.

BACKGROUND OF THE INVENTION

This invention relates to producing modulated gradient fields in magnetic resonance imaging (MRI) systems.

A variety of modulated gradient field waveforms are known to be useful in MRI systems. Some MRI systems, such as those disclosed in Rzedzian U.S. Pat. No. 4,628,264, produce a sinusoidally varying gradient field by sinusoidally driving a circuit comprising the gradient coil connected in parallel with a capacitor. The desired current is realized by selecting a capacitor/coil combination with a resonant frequency corresponding to the desired gradient field frequency, and driving the coil at that frequency with a sinusoidal voltage source. In this way, the voltage source supplies only a small fraction (1/Q, where Q is the quality factor of the resonant capacitor/coil circuit) of the coil current. The majority of the coil current comes from the resonant discharge of the capacitor.

Other MRI systems produce a steady gradient field by driving the gradient coil with a pulse of constant amplitude. The leading and trailing edges of these pulses rise and fall gradually, consistent with limits on the rate at which the current through the gradient coil can be changed. For example, trapezoidal pulses of coil current are often used.

SUMMARY OF THE INVENTION

The invention features a series topology for the coil and storage capacitor in the circuitry driving the coil of an MRI system. The coil and capacitor thus form a series resonant circuit that can deliver a sinusoidal current through the coil at a resonant frequency. A power source and switch are connected in series with the coil and capacitor, and current flow to the coil is initiated and interrupted by closing and opening the switch.

In preferred embodiments, a second switch is connected in parallel with the capacitor, to shunt current around the capacitor, thus permitting the coil to be driven directly by the power source; a precharging circuit (which preferably receives its power from the same power source as used for driving the coil) is connected to the capacitor; run controller circuitry opens and closes both switches to produce varying types of pulses; the pulses have at least one sinusoidal segment comprising a portion of a sinusoid of the resonant frequency; a nonsinusoidal segment (e.g., one of constant amplitude) preferably follows the first sinusoidal segment and a second sinusoidal segment follows the nonsinusoidal one; the sinusoidal segments consist of an integral number of quarter cycles of a sinusoid of the resonant frequency.

The circuitry can thus advantageously be used to generate both sinusoidally varying and steady gradient fields in an MRI system. Sinusoidally varying gradient fields can be generated by closing the switch in series with the capacitor to initate a sinusoidal resonance. Steady gradient fields can be generated in three segments: (1) a first sinusoidal segment produced by allowing the series resonant circuit to resonate for a quarter cycle, during which time current rises from zero a maximum value; (2) a constant amplitude segment produced by shunting across the capacitor so that the power source drives the coil directly, during which time the current remains at the maximum value; and (3) a second sinusoidal segment produced by allowing the series resonant circuit to resonate for another quarter cycle, during which time current falls from a maximum to zero.

Other features and advantages of the invention will be apparent from the description of the preferred embodiment and from the claims.

DESCRIPTION OF THE PREFERRED EMBODIMENT

As explained in detail in U.S. Pat. No. 4,628,264 issued to Rzedzian, incorporated herein by reference, it is known in the art of MRI systems imaging to superimpose a modulated gradient magnetic field over a static magnetic field. Two useful waveforms for generating the gradient field are a pulse of sinusoidal oscillations and a DC pulse of constant amplitude.

To achieve a sinusoidal oscillation in the gradient field, a sinusoidal current $I_o$ is driven through the gradient coil. Ideally, $I_o$ has the waveform:

$$I_o = I_x \cdot \sin(w_o t)$$

where $w_o$ is the desired angular frequency and $I_x$ is the peak current needed to yield the desired gradient field.

For a DC pulse of constant amplitude, $I_o$ should ideally have a perfectly rectangular waveform. However, since instantaneous changes in coil current are impossible, perfect rectangularity cannot be achieved. Thus, the drive current must gradually rise and fall at the beginning and end of the pulse.

Figure 1:
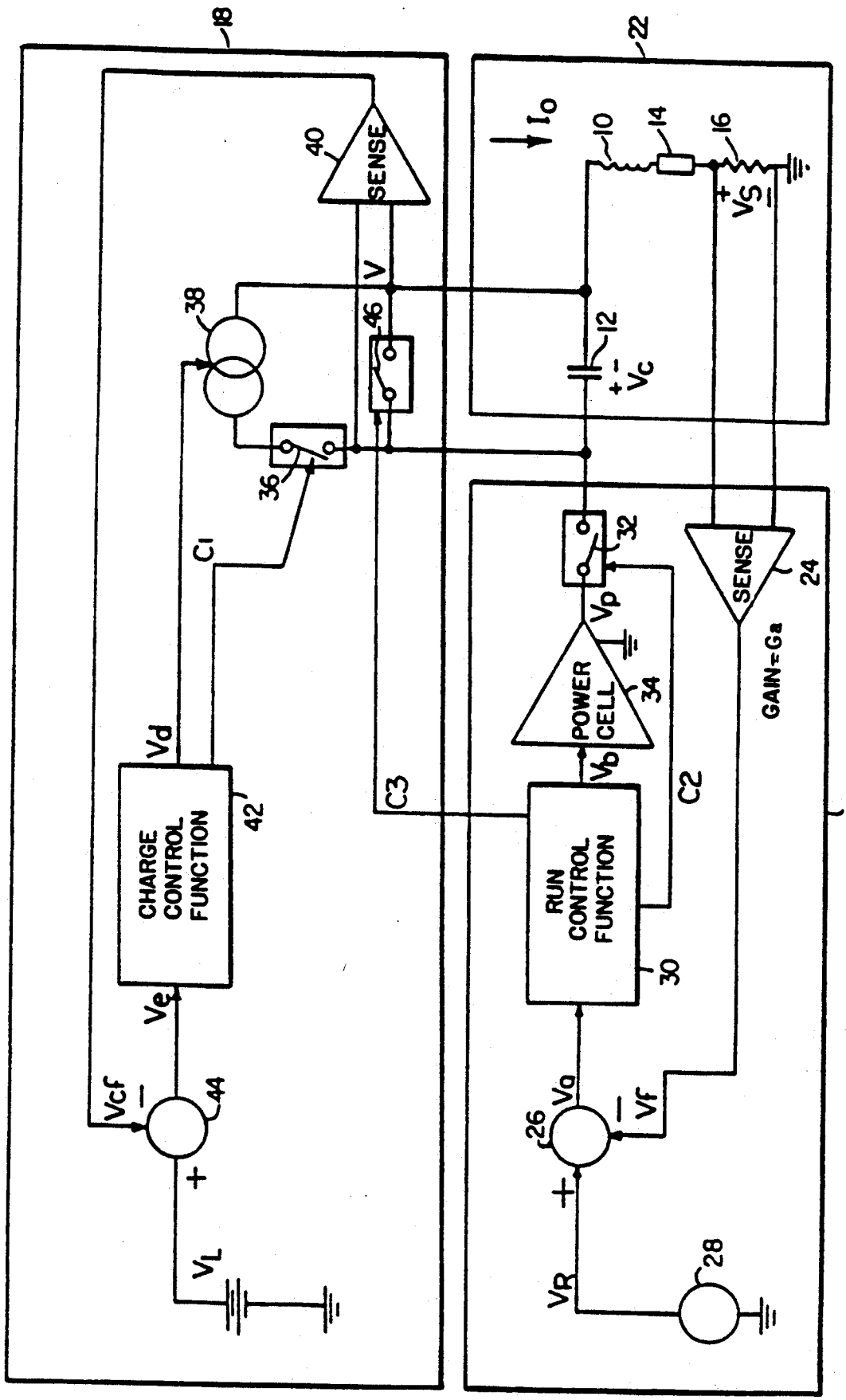
FIG. 1 is a simplified block diagram helpful for understanding the invention.

Shown in FIG. 1 is a simplified block diagram of an embodiment of the invention. Coil 10, for generating the gradient field, is connected in series with capacitor 12 and current-measuring shunt resistor 16. Parasitic resistor 14 (also shown in series with coil 10) represents the total circuit losses, which are primarily due to coil 10. Capacitor charging circuitry 18 is connected across capacitor 12 to pre-charge the capacitor prior to passing any current through coil 10. Control of coil current $I_o$ is handled by control circuitry 20. The load driven by control circuit 20 is represented by load 22, which consists of the series combination of coil 10, capacitor 12, parasitic resistor 14, and shunt resistor 16. Circuitry 20 controls coil current $I_o$ by operating run switch 32 and by controlling voltage $V_p$ across load 22. The resultant current $I_o$ in coil 10 has a waveform determined by voltage $V_p$, the initial capacitor voltage $V_{co}$, and the impedance characteristics of the load.

In one mode of operation, to energize coil 10 with sinusoidal current $I_o$, voltage $V_p$ is chosen to have a sinusoidal waveform. To minimize the power voltage demand on control circuitry 20, load 22 is designed to have a resonant frequency equal to the desired frequency $W_o$ of sinusoidal current $I_o$ and to have a high quality factor Q. This allows control circuit 20 to achieve the desired high drive current $I_o$ by maintaining $V_p$ at the resonant frequency with a relatively low amplitude. More specifically, since the impedance of load 22 at its resonant frequency equals the pure load resistance, the drive voltage $V_p$ needed to yield $I_o$ is given by:

$$V_p = I_o \cdot R_{sum} = I_x \cdot R_{sum} \cdot \sin(w_o t)$$

where $R_{sum}$ is the sum of the resistances of parasitic resistor 14 and shunt resistor 16. Accordingly, to minimize the power required from control circuitry 20, $R_{sum}$ should be kept as small as practical.

To yield the desired magnetic field, a coil with a relatively large inductance is required. In preferred embodiments, a gradient coil with a measured inductance L of 1,025 microHenries is used. Accordingly, for load 22 to have a resonant frequency equal to a desired current frequency of 1.00 KHz, capacitor 12 must have a capacitance C of 24.7 microfarads.

To achieve accuracy in an MRI system using a sinusoidal waveform, $I_x$ must remain constant. Toward this end, the series resonant system of FIG. 1 uses a feedback architecture which monitors coil current $I_o$ and adjusts driving voltage $V_p$ to maintain the desired coil current $I_o$. Current sensing amplifier 24 detects voltage $V_s$ across a small, precisely known, shunt resistor 16 and amplifies $V_s$ with gain $G_a$ to produce feedback voltage $V_f$, which is proportional to coil current $I_o$. Difference node 26 subtracts voltage $V_f$ from sinusoidal reference voltage $V_R$ provided by signal generator 28. The gain $G_a$ of current sensing amplifier 24 places feedback voltage $V_f$ on the same scale as reference voltage $V_R$ so that any difference between voltages $V_f$ and $V_R$ represents undesired error $V_a$ in the magnitude of coil current $I_o$. This scale is chosen to maximize the dynamic range of the system.

Difference node 26 provides error signal $V_a$ to the input of run controller 30, which operates on the error signal with a phase compensating transfer function designed to provide appropriate gain and phase compensation to yield maximum stable feedback loop gain. In preferred embodiments, the phase compensation is provided with a transfer function of $(s+w_o)/s$, where s is the Laplace operator. This amounts to an integration of all error signal frequency components from DC to $w_o$. The resultant output control voltage $V_b$ is applied to the input of power cell 34. The power cell 34 drives load 22 with voltage $V_p$, which tracks control voltage $V_b$. This feedback architecture extends the high precision of reference voltage $V_R$ to coil current $I_o$.

As explained in Rzedzian U.S. Pat. No. 4,628,264, undesirable transients in coil current may occur when a stimulus voltage, such as $V_p$, is first applied to a tuned circuit such as load 22. Rzedzian discloses that such transients can be avoided by properly initializing the tuned circuit. More specifically, Rzedzian discloses precharging a capacitor in the tuned circuit to a voltage corresponding to the peak capacitor voltage in the desired steady state.

To avoid transients, charging circuitry 18 precharges capacitor 12 to an initial voltage $V_{co}$ equal to the peak capacitor voltage $V_x$ generated when load 22 resonates with the desired coil current $I_o$. In the series topology of the present invention, the capacitor voltage signal $V_c$ is given by:

$$V_c = Z_c \cdot I_o = \frac{1}{w_o C} \cdot I_x \sin(w_o t)$$

where $Z_c$ represents the capacitor's impedance. The resonant frequency $w_o$ equals $1/\sqrt{LC}$, where L is the inductance of gradient coil 10 and C is the capacitance of capacitor 12. Thus it follows that:

$$V_c = \sqrt{L} / \sqrt{C} \cdot I_x \cdot \sin(w_o t)$$

$$V_x = \sqrt{L} / \sqrt{C} \cdot I_x$$

To initiate the precharge mode, charging switch 36 is closed to connect current source 38 across capacitor 12. A feedback architecture is used to control Current source 38 to closely match the magnitude of the initial voltage $V_{co}$ to voltage $V_x$ calculated by the above equation.

More specifically, voltage sensing amplifier 40 reads the voltage on capacitor 12 to provide a measured capacitor voltage $V_{cf}$. The difference between measured capacitor voltage $V_{cf}$ and a reference voltage $V_L$ (which prescribes the desired capacitor voltage) is fed as error signal $V_e$ to controller 42, which, in turn, supplies charge control voltage $V_d$ to current source 38.

Figure 3:
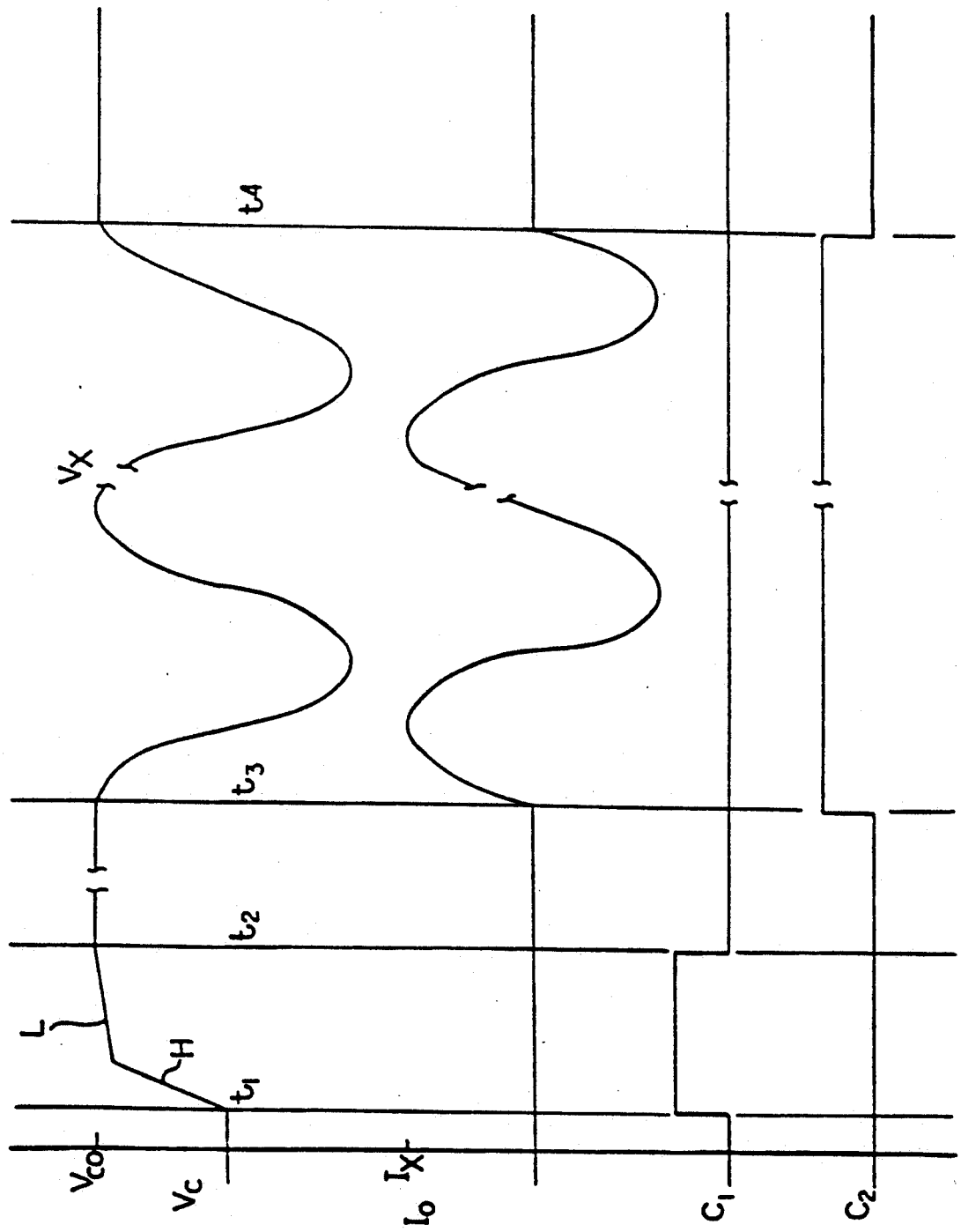
FIG. 3 is a timing diagram of signals produced by the structure depicted, in FIG. 1 during the precharging of the capacitor and during the delivery of a sinusoidal pulse of current to the magnetic field-generating coil.

FIG. 3 illustrates, the sequence in which the feedback architecture adjusts capacitor voltage $V_c$ until the measured capacitor voltage $V_{cf}$ precisely corresponds to reference voltage $V_L$. Controller 42 (FIG. 1) initiates the precharge operation at a time $t_1$ by asserting control signal C1 to close charge switch 36. A dual-rate charging scheme is used, in which the capacitor is first charged to within a few percent of the desired level at a high rate H ($V_d$ at a relatively high amplitude) and then charged more precisely at a lower rate L ($V_d$ at a relatively low amplitude). The resultant reduction in charging current minimizes parasitic effects and the errors they induce. Once the capacitor voltage is substantially equal to $V_x$, charging is terminated at time $t_2$, by controller 42 opening charge switch 36, removing current source 38 from the circuitry driving capacitor 12.

Once capacitor 12 has been charged, run controller initiates a sinusoidal pulse of current through gradient coil 10 by asserting control signal C2 at time $t_3$. This closes run switch 32, and allows capacitor 12 to discharge into coil 10. Load 22 immediately begins to resonate at the resonant frequency $w_o$, with energy being transferred back and forth between the capacitor and the coil. At the same time, run controller 30 provides energy, in the form of voltage $V_p$, to compensate for resistive losses. Run controller 30 terminates at time $t_4$ the sinusoidal pulse by opening run switch 32 at the precise instant when capacitor 12 is fully charged and coil current $I_o$ is zero, thus avoiding the need to recharge the capacitor for subsequent pulses.

The series configured drive circuitry of FIG. 1 is also capable of providing DC pulses of drive current. This is possible in view of the fact that with series topology, the power cell carries the entire load current. As in the sinusoidal mode of operation, capacitor 12 must be initialized prior to commencement of a run operation.

In the DC mode, capacitor 12 is pre-charged as for a sinusoidal pulse to the $V_{co}$ required to generate the desired coil current $I_x$ equal to $I_{DC}$.

Figure 4:
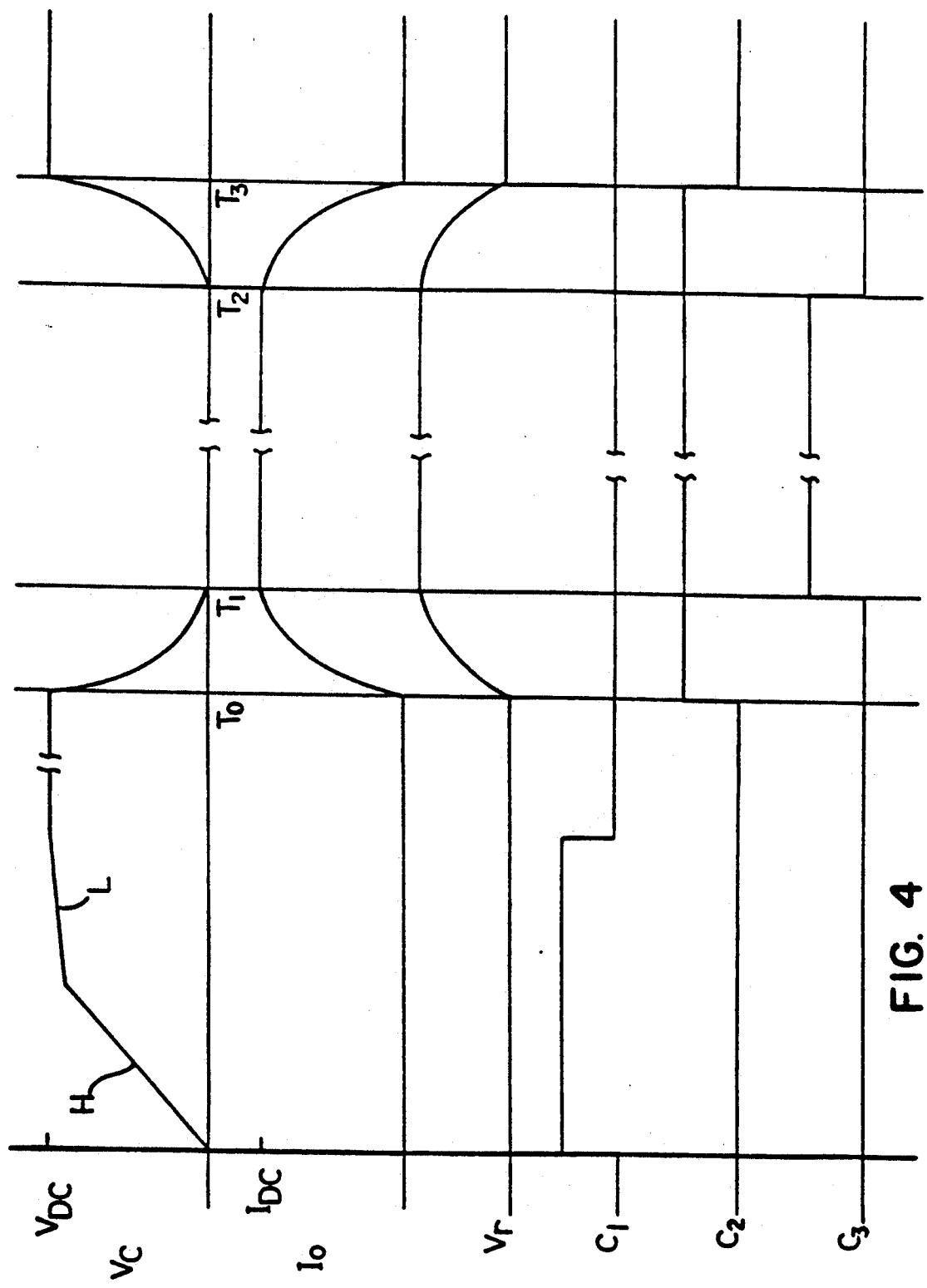
FIG. 4 is timing diagram of signals produced by the structure depicted in FIG. 1 during precharging and during the delivery of a constant amplitude pulse to the coil.

Referring to FIG. 4, at time $T_0$, run controller 30 asserts run control signal C2 to close run switch 32, allowing capacitor 12 to discharge into coil 10 with the same resonant current flow which produced the sinusoidal cycles described above; but the tuned circuit is only allowed to oscillate for a quarter cycle.

At the end of the quarter cycle time segment ($T_1$), when capacitor voltage $V_c$ has reached zero and coil current $I_o$ has reached $I_{DC}$, run controller 30 asserts capacitor bypass control signal C3, thereby closing bypass switch 46 to effectively short capacitor 12. Once capacitor 12 is bypassed, power cell 34 maintains the coil current at level $I_{DC}$.

At time $T_2$, when it is desired to end the constant amplitude segment of the pulse, run controller 30 turns off bypass control signal C3, thereby opening switch 46. This initiates another sinusoidal pulse segment, in which capacitor 12 charges through a quarter cycle of resonant current flow, until capacitor voltage $V_c$ reaches its maximum and coil current $I_o$ reaches zero. At this point ($T_3$), run controller 30 turns off control signal C2, thereby opening run switch 32 and terminating the run operation.

In this manner a positive pulse is achieved having three segments: a constant amplitude segment bounded by two sinusoidal segments each consisting of a quarter cycle of a resonant sinusoid. Other waveforms can also be constructed. For example, the sinusoidal segments can be larger than a quarter cycle; an integral number of quarter wavelengths can be used. The inverse of the above described positive pulse can be achieved by initiating capacitor 12 with a negative voltage. Rectifiers and bridge circuits, such as disclosed in Rzedzian U.S. Pat. No. 4,628,264, may be employed to achieve half and full wave rectification of the sinusoidal segments.

As explained earlier, a separate precharge feedback architecture comprising capacitor charging circuitry 18 must control the initial capacitor voltage $V_{co}$ within a small allowable error. The degree of precision required relates in part to the fact that load 22 is designed to have a high quality factor Q. This results in high voltages across capacitor 12 and coil 10 using only a relatively low voltage $V_p$. As a result, a small error in initializing capacitor 12 can significantly increase the power demand on power cell 34.

Charging circuit 18 is accordingly designed to precharge capacitor 12 to within a fraction of 1% of the ideal level. This is achieved by using the feedback architecture described above. To assure precision in the feedback circuitry, voltage sensing amplifier 40 is a high quality differential amplifier with common-mode rejection. This assures that the feedback signal $V_{cf}$ accurately represents the capacitor voltage. The series inductances in the charging circuit are also carefully minimized to avoid overcharging. To minimize any remaining parasitic effects, a dual-rate charging scheme is used in which the charging rate drops to a relatively slow rate as the capacitor voltage approaches the desired level.

Another important consideration in implementing a series resonant feedback circuit is assuring that the frequency of drive voltage $V_p$ matches the resonant frequency of the load. Given the high quality factor of the load, a mismatch between the drive and resonant frequencies will significantly increase the power demands on power cell 34.

To assure that the resonant frequency of load 12 remains stable over time and with temperature changes, the temperature of the capacitor is kept constant by being positioned in the incoming airstream of the power cell chassis. Further, the capacitors themselves have a low dissipation factor and low temperature coefficient of capacitance. A bank of twelve 2.0 microfarad capacitors with a 2 KV peak rating are combined with sufficient trim capacitors (all of General Electric series 28F5600).

Steps are also taken to assure stability in control circuitry 20. Run controller 30, difference node 26, and reference signal generator 28 are implemented with a digital computer clocked by a highly stable crystal oscillator.

Another consideration is DC error in the current sensing amplifier 24. As explained earlier, run controller 30 integrates all low frequency components of error signal $V_a$. Since run controller 30 cannot distinguish DC errors in $V_a$ introduced by sensing amplifier 24 from real errors in current $I_o$, controller 30 responds to DC errors in amplifier 24 by distorting $I_o$ and its integral. Furthermore, any offset current $I_{os}$ introduced by controller 30 creates a voltage ramp on capacitor C with the slope:

$$dv_c/dt = I_{os}/C$$

To control these errors, current sensing amplifier 24 is a high quality differential amplifier chosen to have DC stability. Further, as with capacitor 12, airflow is provided over amplifier 24 to minimize temperature variations and further reduce drift.

Figure 2:
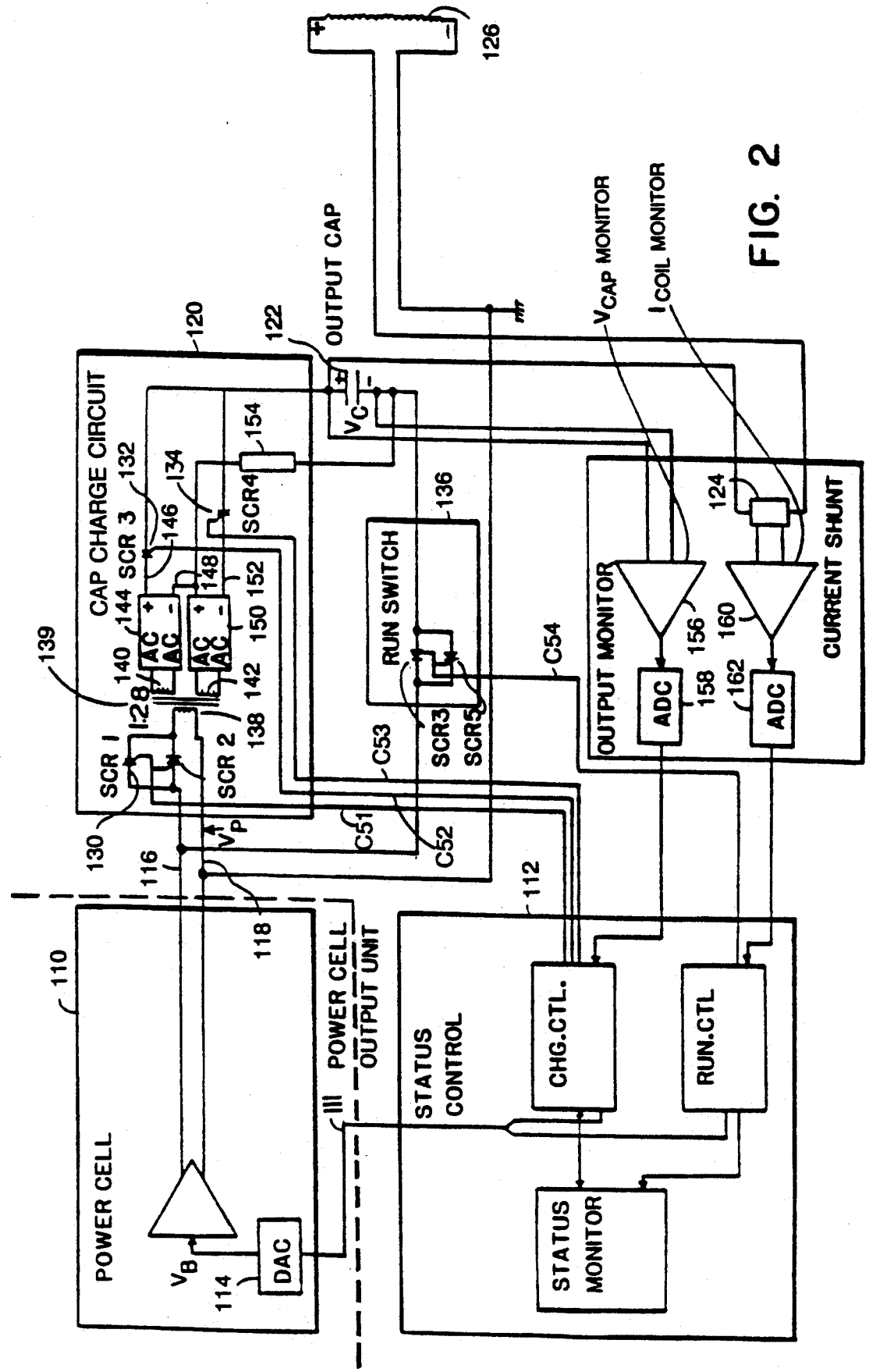
FIG. 2 is a block diagram of a preferred embodiment of the invention.

FIG. 2 shows the preferred embodiment. A single, bipolar power cell 110 is used to provide energy for both precharge and run operations. Digital controller 112 controls the operation of power cell 110 during both operations. A digital control signal on line 111 prescribing the output of the power cell is delivered by controller 112, and converted by DAC 114 into a corresponding analog voltage $V_B$. The power cell generates a high power output across terminals 116, 118 in precise conformity to voltage $V_B$.

Differential output terminals 116, 118 are connected across the series resonant load, which consists of capacitor 122, shunt resistor 124, and coil 126. Terminals 116, 118 are also connected to capacitor charge circuit 120 to supply energy during the precharge operation.

The multiplexing of the output of power cell 110 between the two operations of the precharging and running is controlled by digital controller 112. The controller activates capacitor charge circuit 120 by asserting control signals CS1, CS2, CS3 to close charging switches 130, 132, 134 (SCR1, SCR2, SCF3, SCR4). To select a run operation, controller 112 asserts control signal CS4 to close run switch 136 (SCR5, SCR6).

To execute a precharge operation, controller 112 supplies a 15 KHz sinusoidal input to the power cell input line 111 causing the power cell to produce a corresponding 15 KHz sinusoidal voltage $V_p$ across terminals 116, 118. Controller 112 next asserts control signal CS1 to close charging switch 130. Upon the closing of switch 130, the 15 KHz current flows in primary coil 138 of step-up transformer 139 and provides a 15 KHz voltage at the output of each of secondary coils 140, 142.

Low inductance connections are used on the primary side of transformer 139 (e.g., for lines 116, 118) to minimize parasitic inductance.

The voltage generated by secondary coil 140 is applied to high-voltage rectifier 144 which produces a corresponding positive DC voltage across terminals 146, 148. Similarly, the voltage generated by secondary coil 142 is applied to high-voltage rectifier 150 to produce a negative DC voltage across terminals 148, 152.

Controller 112 selects a positive precharge voltage by asserting control signal CS2 to close charging switch 132. The voltage $V_c$ across capacitor 122 accordingly rises to the voltage of rectifier 144 at a rate limited by current limiting resistor 154. To select a negative precharge voltage, controller 112 instead asserts control signal CS3, thereby causing the capacitor voltage to reach the negative level set by the output of rectifier 150.

As explained above in connection with FIG. 1, feedback architecture is used to precisely control the magnitude of the capacitor precharge voltage. In this regard, the voltage across capacitor 122 is read by voltage sensing amplifier 156 and converted to digital form by ADC 158. Controller 112 compares the sensed capacitor voltage with a predetermined digital reference voltage stored in the controller's memory. Based on the result of that comparison, controller 112 adjusts the power cell output. Using a dual rate charging scheme, controller 112 brings the capacitor voltage to the desired level.

Once capacitor 122 is precharged, controller 112 begins a run operation by asserting control signal CS4 to close run switch 136 and thereby initiate current flow into coil 126. Voltage sensing amplifier 160 reads the voltage across shunt resistor 124 to provide a voltage representative of the coil current. After being converted to digital form by ADC 162, the voltage is compared with a preset digital signal stored in the controller.

Controller 112 internally calculates an error signal ($V_a$, FIG. 1) and an appropriate correction signal ($V_b$, FIG. 1). The appropriate correction signal is then supplied to power cell 110 on input line 111. In this manner, controller 112 implements the operation of run controller 30, charge control circuitry 42, voltage references $V_R$ and $V_L$, and difference nodes 26, 44 (FIG. 1). Status monitor 180 provides an operator interface.

To minimize the DC offset problems discussed above, both sensing amplifier 160 and ADC 162 should be chosen to minimize DC offset. Further, proper airflow over these components should be provided to minimize temperature variation.

Other embodiments are within the following claims.

We claim:

1. Circuitry for generating a magnetic field in a magnetic resonance imaging system by driving a magnetic-field-generating coil with a sinusoidal waveform of a selected amplitude and selected frequency, the circuitry comprising:

a current-carrying coil for generating a magnetic field;

a capacitive element connected in series with the coil, said coil and capacitive element forming a series resonant circuit having said selected frequency as its resonant frequency;

a first switch circuit connected in series with said capacitive element, said first switch circuit having an open position in which current through the coil and capacitive element is interrupted and a closed position in which current is permitted to flow;

a power source connected in series with said coil, capacitive element and said first switch circuit, said power source being configured to drive said series connected capacitive element and coil with a sinusoidal signal at said selected frequency when said first switch circuit is in the closed position; and a precharging circuit connected to said capacitive element for storing energy in said capacitive element in an amount sufficient to cause said series connected capacitive element and coil to resonant at said selected frequency and selected amplitude when said first switch is initially closed.

2. In a magnetic resonance imaging system, circuitry for driving a magnetic field-generating coil with a sinusoidal waveform of a selected amplitude and selected frequency, the circuitry comprising:

a capacitive element connected in series with the coil, said coil and capacitive element forming a series resonant circuit having said selected frequency as its resonant frequency;

a first switch circuit connected in series with said capacitive element, said first switch circuit having an open position in which current through the coil and capacitive element is interrupted and a closed position in which current is permitted to flow;

a power source connected in series with said coil, capacitive element and said first switch circuit, said power source being configured to drive said series connected capacitive element and coil with a sinusoidal signal at said selected frequency when said first switch circuit is in the closed position; and a precharging circuit connected to said capacitive element for storing energy in said capacitive element in an amount sufficient to cause said series connected capacitive element and coil to resonate at said selected frequency and selected amplitude when said first switch is initially closed.

3. The circuitry of claim 1 or 2 further comprising a second switch circuit connected in parallel with said capacitive element, said second switch having a closed position in which current is shunted around said capacitive element and an open position in which current is permitted to flow into said capacitive element, said power source being configured to drive said series connected capacitive element and coil with a steady signal when current is shunted around said capacitive element.

4. The circuitry of claim 1 or 2 wherein said precharging circuit receives its power from said power source and wherein switches are provided for switching said power source into and out of connection with said precharging circuit.

5. The circuitry of claim 3 further comprising run controller circuitry connected to said first and second switch circuits for selectively opening and closing said switch circuits.

6. The circuitry of claim 5 wherein said run controller circuitry includes means for opening and closing said switch circuits to produce a current pulse comprising at least one sinusoidal segment, said segment consisting of a portion of a first sinusoid of said resonant frequency.

7. The circuitry of claim 6 wherein said sinusoidal segment consists of an integral number of quarter cycles of said first sinusoidal of said resonant frequency and wherein each said segment begins and ends at times when the amplitude of said sinusoid is either substantially at zero or substantially at a positive or negative maximum.

8. The circuitry of claim 7 wherein said current pulse further comprises at least one nonsinusoidal segment following said sinusoidal segment and wherein the transition between said sinusoidal segment and nonsinusoidal segment occurs at a time when said first sinusoid is substantially at a positive or negative maximum.

9. The circuitry of claim 7 wherein said pulse further comprises a second said sinusoidal segment following said nonsinusoidal segment, said second sinusoidal segment consisting of an integral number of quarter cycles of a second sinusoid having said resonant frequency and having a maximum amplitude substantially equal to the amplitude at the transition between said nonsinusoidal and second sinusoidal segments.

10. The circuitry of claim 9 wherein said first and second sinusoids have substantially equal maximum amplitudes.

11. The circuitry of claim 10 wherein said nonsinusoidal segment has a substantially constant amplitude substantially equal to said maximum amplitudes of said sinusoidal segments.

12. The circuitry of claim 11 wherein said transitions between said sinusoidal segments and said nonsinusoidal segment occur at times when the voltage across said capacitor is substantially zero.

13. The circuitry of claim 12 wherein said first and second sinusoidal segments each consist of only one quarter cycle of said sinusoid.

14. The circuitry of claim 8 wherein said current pulse comprises only one nonsinusoidal segment.

15. The circuitry of claim 8 wherein said run controller means includes means for controlling said first and second switch circuits to produce said pulse made up of first and second sinusoidal and nonsinusoidal segments, said means comprising
   means for closing said first switch circuit to initiate current flow from said capacitive element through said coil, to being said first sinusoidal segment,
   means for closing said second switch circuit when the voltage across said capacitive element is substantially zero, to terminate said first sinusoidal segment and initiate said nonsinusoidal segment,
   means for opening said second switch circuit, after a time delay, to terminate said nonsinusoidal segment and initiate said second sinusoidal segment, and
   means for opening said first switch circuit when the current through said coil is zero to terminate said second sinusoidal segment.

16. The circuitry of claim 6 wherein said pulse comprises three segments:
   a first said sinusoidal segment of quarter cycle duration and rising from zero amplitude to a maximum amplitude,
   a nonsinusoidal segment following said first sinusoidal segment and having a substantially constant amplitude substantially equal to said maximum amplitude,
   a second said sinusoidal segment of quarter cycle duration following said nonsinusoidal segment and falling from said maximum amplitude to zero amplitude.

17. The circuitry of claim 16 wherein said control circuitry includes means for making the transitions between said sinusoidal and nonsinusoidal segments at times when the voltage across said capacitive element is substantially zero.

18. The circuitry of claim 16 wherein said capacitive element and said power source are for connection in series with said coil.

19. A method of generating a magnetic field for magnetic resonance imaging, wherein a magnetic-field-generating coil is driven at a selected frequency and selected amplitude, the method comprising the steps of:
   (A) connecting in series a capacitive element, magnetic field-generating coil, first switch, and power source to form a series resonant circuit having said selected frequency as its resonant frequency;
   (B) using a precharging circuit to store energy in the capacitive element in an amount sufficient to produce a sinusoidal resonance in the series resonant circuit at said selected frequency and selected amplitude when the first switch is initially closed;
   (C) closing the first switch to cause the resonant circuit to begin resonating in a sinusoidal resonance at said selected frequency;
   (D) providing input power from the power source to maintain the amplitude of the resonance, said input power comprising a sinusoid at the selected frequency.

20. The method of claim 19 further comprising the steps of:
   (E) connecting a second switch in parallel with the capacitive element,
   (F) closing the second switch to bypass the capacitive circuit after a period of resonance when the voltage across the capacitive element is substantially zero and the coil current is substantially at its resonant peak,
   (G) providing input power from the power circuit for a desired duration,
   (H) opening the second switch to resume resonance, and
   (I) opening the first switch after a further period of resonance at a time when the coil current is substantially zero.

21. The method of claim 20 wherein the current driven through said coil remains substantially constant during the time said second switch is closed.

22. The method of claim 20 wherein the time interval between closing said first switch and opening said first switch has a duration equal to an integral number of quarter cycles of a sinusoid of said resonant frequency.

* * * * *

UNITED STATES PATENT AND TRADEMARK OFFICE
CERTIFICATE OF CORRECTION

PATENT NO.   : 5,285,161                                Page 1 of 2

DATED        : 2/8/94

INVENTOR(S)  : Richard Rzedzian and Stephen Crump

It is certified that error appears in the above-identified patent and that said Letters Patent is hereby corrected as shown below:

On the Title Page, Item [56], column 2, line 1, References Cited U.S. PATENT DOCUMENTS, "Kuplainen" should be --Kupiainen--.

On front cover, insert the following after [56] References Cited U.S. PATENT DOCUMENTS:

--FOREIGN PATENT DOCUMENTS

| | | |
|---|---|---|
| 3415041 | 10/84 | Germany |
| 0429715 | 6/91  | Europe |
| 0389666 | 10/90 | Europe |
| 2184625 | 6/87  | Great Britain |

OTHER PUBLICATIONS

Kim et al., "Whole Body NMR Spiral-Scan Echo Planar Imaging (SEPI) Using Resonant Gradient Coil," Society of Magnetic Resonance in Medicine, Book of Abstracts, Vol. 2, p. 1013 (1988).

UNITED STATES PATENT AND TRADEMARK OFFICE
CERTIFICATE OF CORRECTION

PATENT NO.   : 5,285,161

DATED        : 2/8/94

INVENTOR(S)  : Richard Rzedzian and Stephen Crump

It is certified that error appears in the above-identified patent and that said Letters Patent is hereby corrected as shown below:

Hoult et al., "Rapid and Efficient Transfer of Energy Between Inductors, With Application to Magnetic Resonance Imaging," Review of Scientific Instruments, Vol. 61, No. 4, pp. 1277-1280 (1990).--

Column 4, line 20, "Current" should be --current--.

Column 4, line 48, after "controller", insert --30--.

Signed and Sealed this

Ninth Day of August, 1994

BRUCE LEHMAN

*Attest:*

*Attesting Officer*          *Commissioner of Patents and Trademarks*